United States Patent
Sukigara et al.

[11] Patent Number: 5,985,050
[45] Date of Patent: Nov. 16, 1999

[54] SMFE-BASED MAGNETOSTRICTIVE MATERIAL

[75] Inventors: Toru Sukigara; Teruyoshi Kita; Jun Takizawa, all of Saitama, Japan

[73] Assignee: Honda Giken Kogyo Kabushiki Kaisha, Tokyo, Japan

[21] Appl. No.: 08/940,223

[22] Filed: Sep. 30, 1997

[30] Foreign Application Priority Data

Sep. 30, 1996 [JP] Japan ................................ 8-278637

[51] Int. Cl.⁶ .......................... H01L 41/20; C22C 38/00
[52] U.S. Cl. ........................................... 148/302; 420/416
[58] Field of Search .............................. 420/416; 148/302

[56] References Cited

FOREIGN PATENT DOCUMENTS

| | | |
|---|---|---|
| 1081279 | 1/1994 | China . |
| 601943 | 6/1994 | European Pat. Off. . |
| 294974 | 10/1991 | Germany . |
| 60-066802 | 4/1985 | Japan . |
| 1184244 | 7/1989 | Japan . |
| 2145739 | 6/1990 | Japan . |
| 5171323 | 7/1993 | Japan . |

OTHER PUBLICATIONS

Mukai, T; Fujimoto, T, Boron–modified 2:17–type samarium–cobalt–iron–copper–zirconium ($Sm(Co,Fe,Cu,Zr)_z$) sintered magnets, J. Appl. Phys. (1988), 64(10, Pt.2), 5977–9 (abstract only).

*Primary Examiner*—Sikyin Ip
*Attorney, Agent, or Firm*—Lyon & Lyon LLP

[57] ABSTRACT

A SmFe-based magnetostrictive material having an excellent magnetostrictive performance and an excellent mechanical strength provided by achieving a division of crystal grains. The SmFe-based magnetostrictive material includes boron (B) as an additive component, which contributes to the fine division of crystal grains. The content of boron (B) is set in a range of $B \leq 0.01\%$ by weight.

13 Claims, 4 Drawing Sheets

EXAMPLE 1 (B : 0.001 % BY WEIGHT)

100 μm

EXAMPLE 7 (B : 0 % BY WEIGHT)

100 μm

SMFE-BASED MAGNETOSTRICTIVE MATERIAL

The present invention relates to an SmFe-based magnetostrictive material.

BACKGROUND OF THE INVENTION

In an SmFe-based magnetostrictive material, it is necessary to finely divide or atomize the crystal grains of the SmFe-based magnetostrictive material in order to enhance the magnetostrictive performance in a lower magnetic field and to enhance the mechanical strength. The means that has been conventionally employed to accomplish this involves carrying out a casting operation of the material using a casting mold of copper having a larger thermal capacity to quench and solidify the molten metal. However, this conventional casting means is accompanied by a disadvantage that smaller and larger-sized grains of the SmFe-based magnetostrictive material are liable to be irregularly mixed together, because the size of the crystal grains is governed by the shape, the thermal capacity and the like of the casting mold of copper, and the specific heat, the vapor pressure and the like of the SmFe-based magnetostrictive material.

SUMMARY OF THE INVENTION

It is an object of the present invention to provide an SmFe-based magnetostrictive material, wherein the fine division of the crystal grains can be achieved by utilizing the production of irregular nuclei by boron (B) which is an additive component.

To achieve the above object, according to the present invention, there is provided an SmFe-based magnetostrictive material, which includes boron (B) as an additive component, the content of boron (B) being in a range of $B \leq 0.01\%$ by weight.

If boron (B) is added in an amount of $B \leq 0.01\%$ by weight (0% by weight of boron is not included) into a starter material of SmFe, in a molten metal of the SmFe-based magnetostrictive material composition the boron functions as a foreign material in the solidification of the molten metal and hence, the production of irregular nuclei occurs to precipitate an SmFe-based alloy on a surface of the boron. This achieves the fine division of the crystal grains in the SmFe-based magnetostrictive material.

Such SmFe-based magnetostrictive material including boron added has a magnetostrictive performance required for a magnetostrictive material for practical use and has a more excellent magnetostrictive performance than that of an SmFe-based magnetostrictive material which does not include boron, depending upon the content of boron. Further, the SmFe-based magnetostrictive material including boron added has a higher hardness than that of the SmFe-based magnetostrictive material which does not include boron. Thus, an increase in the strength of the SmFe-based magnetostrictive material also is achieved.

However, if the content of boron is larger than 0.01% by weight, the hardness of the SmFe-based magnetostrictive material is further increased, but the magnetostrictive performance of the SmFe-based magnetostrictive material is lower than a normal level for the practical use.

DESCRIPTION OF THE PREFERRED EMBODIMENTS

For creating the SmFe-based magnetostrictive material of this invention, a starting material was produced by blending components such that an $SmFe_{1.5}$ (the unit of a numerical value is the number of moles of the atom) alloy as a main component was of 99.999% by weight and boron (B) as an additive component was of 0.001% by weight in the final composition. In this case, boron has a lower specific gravity and is difficult to mix with the other component. Therefore, the boron was blended in the form of an intermetallic compound FeB. In such blending, any of intermetallic compounds $FeB_2$, $SmB_4$, $SmB_6$ and the like may be used.

Then, using a high-frequency melting furnace, the starting material was melted in an atmosphere of argon (Ar) and under a reduced pressure (600 Torr), and the resulting molten metal was poured into a casting mold of copper at a casting temperature of 1,200° C. to produce a first example (example 1 in Table 1 below) of an SmFe-based magnetostrictive material.

Examples 2 to 6 of SmFe-based magnetostrictive materials having different contents of boron and an example 7 of an SmFe-based magnetostrictive material formed of only an $SmFe_{1.5}$ alloy without boron were produced in the same manner, and are listed in Table 1.

Figure 1:
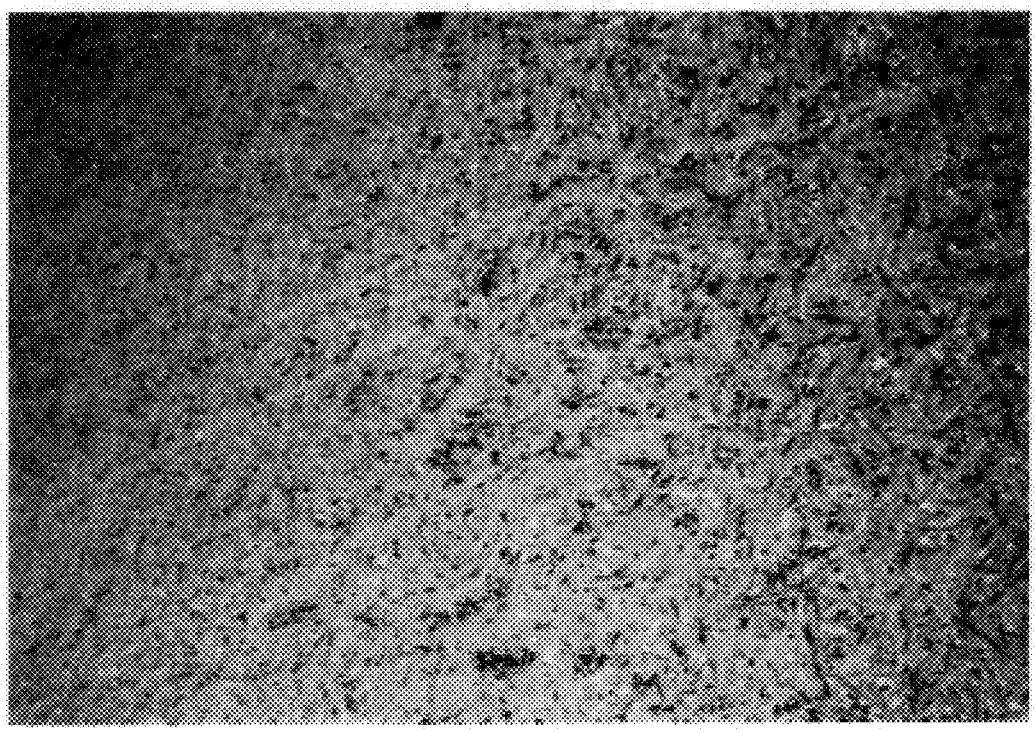
FIG. 1 is a photomicrograph showing the metallographic structure of an example 1 of a SmFe-based magnetostrictive material.
Figure 2:
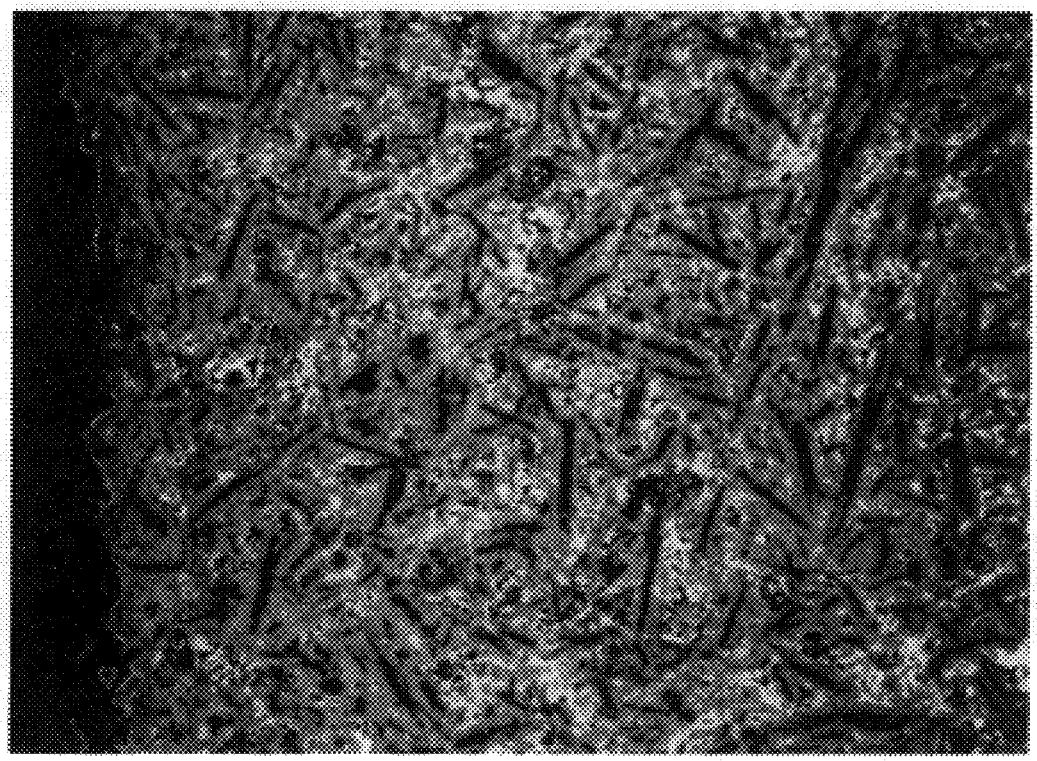
FIG. 2 is a photomicrograph showing the metallographic structure of an example 7 of a SmFe-based magnetostrictive material.

FIG. 1 is a photomicrograph showing the metallographic structure of the example 1, and FIG. 2 is a photomicrograph showing the metallographic structure of the example 7. In FIGS. 1 and 2, a gray phase of $SmFe_2$, a black phase of $SmFe_3$ and a white phase of Sm are observed. If FIGS. 1 and 2 are compared with each other, it is apparent that the crystal grains in the example 1 shown in FIG. 1 were finely divided as compared to the crystal grains in the example 7 shown in FIG. 2. This is attributable to the fact that the example 1 includes boron. However, boron (B) is in the state of a solid-solution in the $SmFe_{1.5}$ alloy and does not appear in FIG. 1.

Each of the examples 1 to 7 was subjected to a thermal treatment where it was heated in a vacuum at 800° C. for 6 hours and then cooled, thereby enhancing the magnetostrictive performance. In this case, the temperature increasing rate from room temperature (about 25° C.) to 800° C. was set at 517° C./hr.

Thereafter, the magnetostriction amount $\lambda$ and Vickers hardness HV of the examples 1 to 7 were measured. The magnetostriction amount $\lambda$ was measured using a strain gauge by applying a magnetic field of 1.5 kOe to each of the examples 1 to 7, and the Vickers hardness HV was measured at a test load of 100 gf using a Vickers hardness meter.

Table 1 shows the content of boron (B), the magnetostriction amount $\lambda$ and the Vickers hardness HV for each of the examples 1 to 7.

TABLE 1

| SmFe-based magnetostrictive material | Content of boron (% by weight) | Magnetostriction amount (ppm) | Vickers hardness HV |
|---|---|---|---|
| Example 1 | 0.001 | 930 | 550 |
| Example 2 | 0.003 | 880 | 580 |
| Example 3 | 0.01 | 600 | 600 |
| Example 4 | 0.1 | 200 | 605 |
| Example 5 | 1.0 | 100 | 610 |
| Example 6 | 5.0 | 40 | 614 |
| Example 7 | 0 | 850 | 500 |

Figure 3:
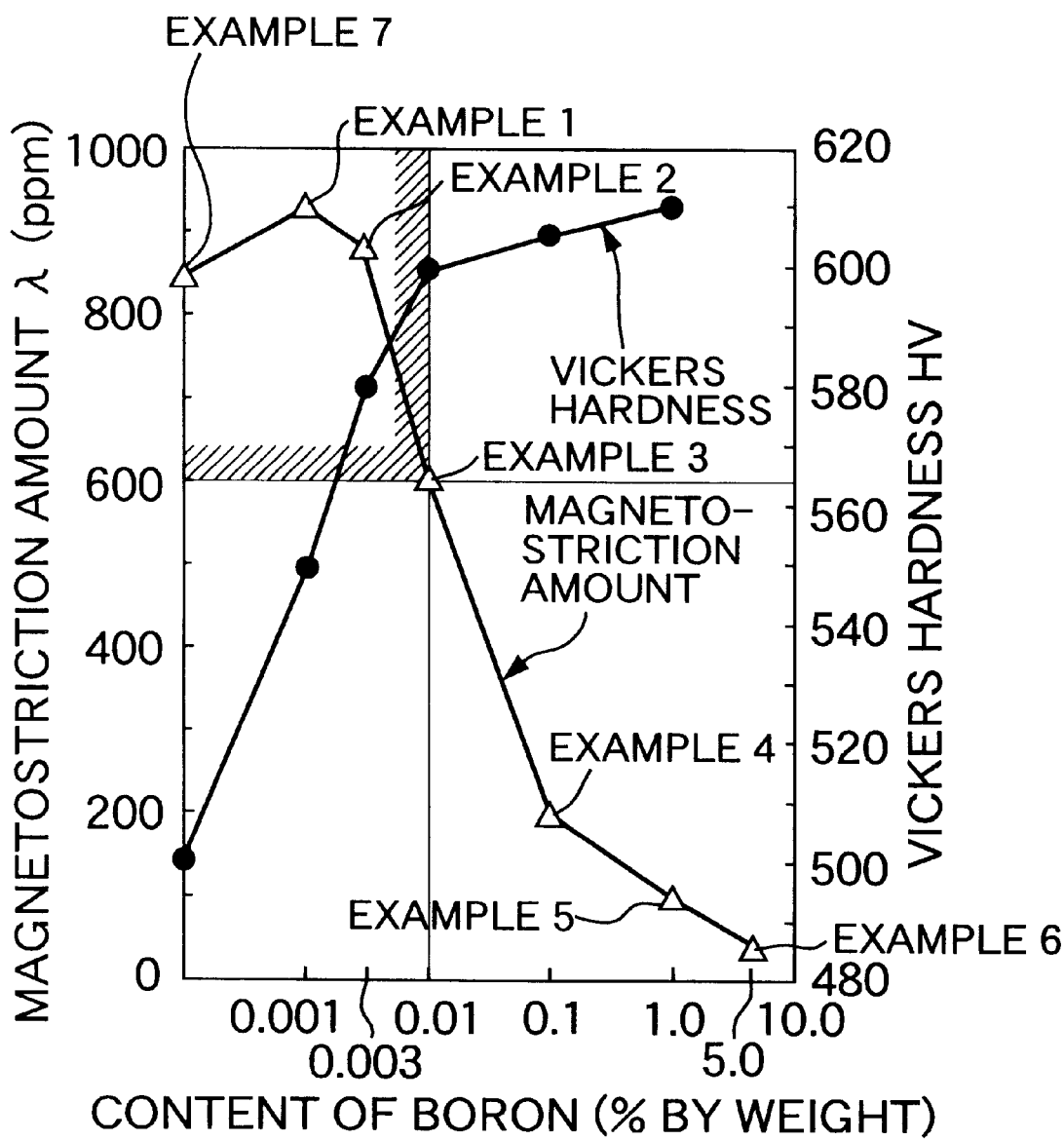
FIG. 3 is a graph illustrating the relationship between the content of boron (B), the magnetostriction amount $\lambda$ and the Vickers hardness HV.

FIG. 3 is a graph taken from the data in Table 1. As is apparent from FIG. 3, the examples 1 to 3 having the content of boron set at a level equal to or smaller than 0.01% by weight have the magnetostriction amount of 600 ppm or more in the magnetic field H of 1.5 kOe, which is a magnetostrictive performance required for a magnetostrictive material for a practical use, and a Vickers hardness HV higher than that of the example 7 having no boron included therein. Particularly, if the content of boron is set at 0.003% by weight or less, as in the examples 1 and 2, the magnetostriction amount $\lambda$ and the Vickers hardness HV are increased more than those of the example 7 having no boron included therein.

Figure 4:
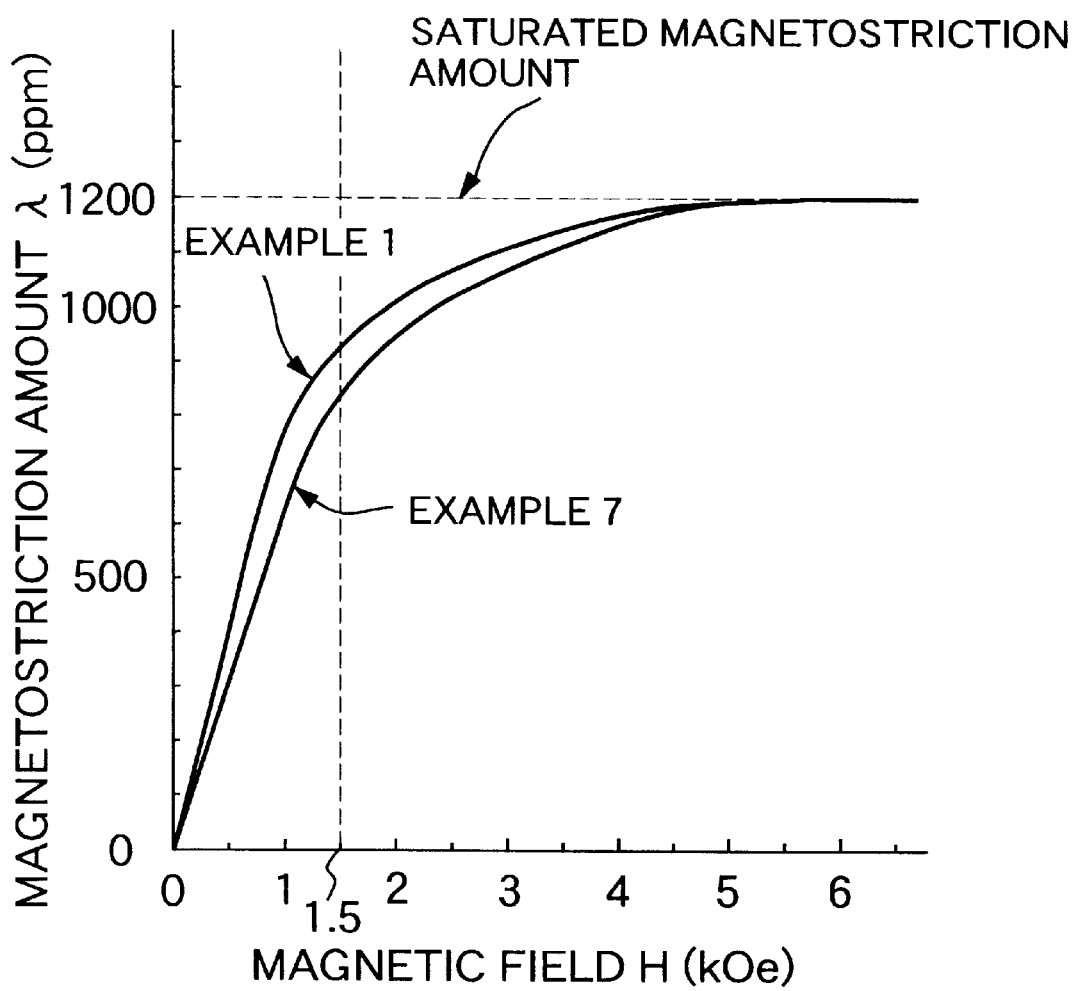
FIG. 4 is a graph illustrating the relationship between the magnetic field H and the magnetostriction amount $\lambda$.

The magnetostrictive amount $\lambda$ was measured using a strain gauge and applying a magnetic field H varying from 0 to 6.0 kOe to the examples 1 and 7. FIG. 4 shows the relationship between the magnetic field H and the magnetostriction amount $\lambda$ in the examples 1 and 7. As is apparent from FIG. 4, if the gradients of both curves, i.e., $\lambda/H$ from a magnetostriction amount of zero is observed, the $\lambda/H$ in the example 1 is larger than that in the example 7. Namely, a relatively large magnetostriction amount $\lambda$ appears in a range of lower magnetic field in the example 1 and hence, the example 1 has an excellent responsiveness as compared to the example 7. The same was found to be true in the example 2 by the same tests.

According to the present invention, it is possible to provide an SmFe-based magnetostrictive material which has an excellent magnetostrictive performance and an excellent mechanical strength provided by achievement of the fine division of the crystal grains by forming the SmFe-based magnetostrictive material as described above.

What is claimed:

1. An SmFe-based magnetostrictive material, which includes an $SmFe_{1.5}$ alloy as a main component and boron (B) as an additive component, said $SmFe_{1.5}$ alloy comprising $SmFe_2$, $SmFe_3$ and Sm phases, the content of the $SmFe_{1.5}$ alloy being equal to or larger than 99.99% by weight, and the content of boron (B) being equal to or smaller than 0.01% by weight.

2. The SmFe-based magnetostrictive material of claim 1, wherein the content of boron (B) is in a range of about 0.001% by weight to about 0.003% by weight.

3. The SmFe-based magnetostrictive material of claim 1, wherein the boron (B) is blended with the $SmFe_{1.5}$ alloy before melting to form the material.

4. The SmFe-based magnetostrictive material of claim 1, wherein the boron (B) is in the form of an intermetallic compound.

5. The SmFe-based magnetostrictive material of claim 1, wherein the boron (B) is in the form of at least one of FeB, $FeB_2$, $SmB_4$ or $SmB_6$.

6. The SmFe-based magnetostrictive material of claim 3, wherein the boron (B) is in the form of an intermetallic compound.

7. The SmFe-based magnetostrictive material of claim 3, wherein the boron (B) is in the form of at least one of FeB, $FeB_2$, $SmB_4$ or $SmB_6$.

8. The SmFe-based magnetostrictive material of claim 1, wherein the material comprises only $SmFe_{1.5}$ and boron.

9. The SmFe-based magnetostrictive material of claim 2, wherein the boron (B) is blended with the $SmFe_{1.5}$ alloy before melting to form the material.

10. The SmFe-based magnetostrictive material of claim 2, wherein the boron (B) is in the form of an intermetallic compound.

11. The SmFe-based magnetostrictive material of claim 2, wherein the boron (B) is in the form of at least one of FeB, $FeB_2$, $SmB_4$ or $SmB_6$.

12. The SmFe-based magnetostrictive material of claim 9, wherein the boron (B) is in the form of an intermetallic compound.

13. The SmFe-based magnetostrictive material of claim 9, wherein the boron (B) is in the form of at least one of FeB, $FeB_2$, $SmB_4$ or $SmB_6$.

* * * * *